(12) United States Patent
Khlat (10) Patent No.: US 12,525,923 B2
(45) Date of Patent: Jan. 13, 2026

(54) EQUALIZER CIRCUIT IN AN ENVELOPE TRACKING INTEGRATED CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 361 days.

(21) Appl. No.: 18/251,312

(22) PCT Filed: Sep. 10, 2021

(86) PCT No.: PCT/US2021/049801
§ 371 (c)(1),
(2) Date: May 1, 2023

(87) PCT Pub. No.: WO2022/103478
PCT Pub. Date: May 19, 2022

(65) Prior Publication Data
US 2024/0022212 A1 Jan. 18, 2024

Related U.S. Application Data

(60) Provisional application No. 63/112,834, filed on Nov. 12, 2020.

(51) Int. Cl.
*H03F 1/30* (2006.01)
*H03F 1/02* (2006.01)
(Continued)

(52) U.S. Cl.
CPC ........... *H03F 1/0222* (2013.01); *H03F 3/195* (2013.01); *H03F 3/245* (2013.01); *H03F 3/72* (2013.01);
(Continued)

(58) Field of Classification Search
CPC ................ H03F 1/30; H03F 3/20; H03G 3/30
(Continued)

(56) References Cited

U.S. PATENT DOCUMENTS 5,507,171 A 4/1996 Mattes et al.
6,032,109 A 2/2000 Ritmiller, III
(Continued)

FOREIGN PATENT DOCUMENTS

JP S601915 A 1/1985
WO 2012151594 A2 11/2012

OTHER PUBLICATIONS

Non-Final Office Action for U.S. Appl. No. 18/324,683, mailed Feb. 27, 2024, 6 pages.
(Continued)

*Primary Examiner* — Henry Choe
(74) *Attorney, Agent, or Firm* — Withrow & Terranova, P.L.L.C.

(57) ABSTRACT

An equalizer circuit in an envelope tracking (ET) integrated circuit (ETIC) is disclosed. The ETIC (26) is configured to generate an ET voltage based on a target voltage (VTGT) for amplifying a radio frequency (RF) signal(s). Since the ETIC has inherent impedance and group delay that can cause distortion in the ET voltage, an equalizer circuit (24) is provided in the ETIC to equalize the target voltage prior to generating the ET voltage. Specifically, the equalizer circuit generates an equalized target voltage to offset the inherent impedance and a modified target voltage to mitigate the group delay. Accordingly, the equalizer circuit can output a processed target voltage, which can include the equalized target voltage and/or the modified target voltage, for generating the ET voltage. As a result, it is possible to reduce distortion resulted from the inherent impedance and group delay, especially when the RF signal(s) is modulated in a wide modulation bandwidth.

18 Claims, 5 Drawing Sheets

(51) Int. Cl.
*H03F 3/195* (2006.01)
*H03F 3/24* (2006.01)
*H03F 3/72* (2006.01)

(52) U.S. Cl.
CPC .. *H03F 2200/102* (2013.01); *H03F 2200/451* (2013.01); *H03F 2203/7221* (2013.01)

(58) Field of Classification Search
USPC .................................. 330/297, 285, 296, 304
See application file for complete search history.

(56) References Cited

U.S. PATENT DOCUMENTS

| | | | |
|---|---|---|---|
| 6,556,077 | B2 | 4/2003 | Schaffer et al. |
| 6,724,202 | B2 | 4/2004 | Tanizawa |
| 7,616,062 | B2 | 11/2009 | Miyamoto et al. |
| 8,649,532 | B2 | 2/2014 | Adachi |
| 10,868,499 | B2 | 12/2020 | Gorisse et al. |
| 11,387,852 | B2 | 7/2022 | Banin et al. |
| 2012/0313701 | A1 | 12/2012 | Khlat et al. |
| 2014/0009227 | A1 | 1/2014 | Kay et al. |
| 2014/0097895 | A1 | 4/2014 | Khlat et al. |
| 2014/0111170 | A1 | 4/2014 | Shi et al. |
| 2014/0213196 | A1 | 7/2014 | Langer et al. |
| 2014/0266428 | A1 | 9/2014 | Chiron et al. |
| 2014/0361837 | A1 | 12/2014 | Strange et al. |
| 2015/0031318 | A1 | 1/2015 | McCallister |
| 2016/0079943 | A1 | 3/2016 | Mallinson |
| 2016/0164550 | A1 | 6/2016 | Pilgram |
| 2016/0277045 | A1 | 9/2016 | Langer |
| 2019/0020526 | A1 | 1/2019 | Khlat et al. |
| 2020/0036338 | A1 | 1/2020 | Gorisse et al. |
| 2020/0106392 | A1 | 4/2020 | Khlat et al. |
| 2020/0153394 | A1 | 5/2020 | Khlat et al. |
| 2020/0259685 | A1 | 8/2020 | Khlat |
| 2021/0211112 | A1 | 7/2021 | Khlat et al. |
| 2022/0224294 | A1 | 7/2022 | Khlat et al. |

OTHER PUBLICATIONS

Notice of Allowance for U.S. Appl. No. 17/412,823, mailed May 15, 2024, 7 pages.
Kelm, Robert, "Understanding Complex-Conjugate Poles in Filter Theory," Technical Article, allaboutcircuits.com/technical-articles/complex-conjugate-poles-in-filter-theory/, Aug. 30, 2016, EETech Media, LLC, 5 pages.
Non-Final Office Action for U.S. Appl. No. 16/199,532, mailed Apr. 17, 2020, 6 pages.
Notice of Allowance for U.S. Appl. No. 16/199,532, mailed Aug. 11, 2020, 7 pages.
Non-Final Office Action for U.S. Appl. No. 17/142,350, mailed Sep. 15, 2022, 9 pages.
European Search Report for European Patent Application No. 21217186.2, mailed Jun. 2, 2022, 13 pages.
International Search Report and Written Opinion for International Patent Application No. PCT/US2021/049801, mailed Jan. 4, 2022, 20 pages.
Written Opinion for International Patent Application No. PCT/US2021/049801, mailed Oct. 12, 2022, 8 pages.
International Preliminary Report on Patentabilty for International Patent Application No. PCT/US2021/049801, mailed Jan. 24, 2023, 21 pages.
Examination Report for European Patent Application No. 21217186.2, mailed Sep. 27, 2024, 8 pages.
Intention to Grant for European Patent Application No. 21789913.7, mailed Jul. 24, 2025, 30 pages.

*FIG. 1A*
*(POWER ART)*

EQUALIZER CIRCUIT IN AN ENVELOPE TRACKING INTEGRATED CIRCUIT

RELATED APPLICATIONS

This application is a 35 USC 371 national phase filing of International Application No. PCT/US2021/049801, filed Sep. 10, 2021, which claims the benefit of U.S. provisional patent application Ser. No. 63/112,834, filed Nov. 12, 2020, the disclosures of which are incorporated herein by reference in their entireties.

FIELD OF THE DISCLOSURE

The present disclosure is related to an equalizer circuit, and in particular, an equalizer circuit in an envelope tracking integrated circuit (ETIC) configured to operate across a wide modulation bandwidth.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as fifth-generation new-radio (5G-NR) technology configured to communicate a millimeter wave (mmWave) radio frequency (RF) signal(s) in an mmWave spectrum located above 12 GHz frequency. To achieve higher data rates, a mobile communication device may employ a power amplifier(s) to increase output power of the mmWave RF signal(s) (e.g., maintaining sufficient energy per bit). However, the increased output power of mmWave RF signal(s) can lead to increased power consumption and thermal dissipation in the mobile communication device, thus compromising overall performance and user experience.

Envelope tracking (ET) is a power management technology designed to improve efficiency levels of power amplifiers to help reduce power consumption and thermal dissipation in mobile communication devices. In an ET system, a power amplifier(s) amplifies an RF signal(s) based on a time-variant ET voltage(s) generated in accordance with time-variant amplitudes of the RF signal(s). More specifically, the time-variant ET voltage(s) corresponds to a time-variant voltage envelope(s) that tracks (e.g., rises and falls) a time-variant power envelope(s) of the RF signal(s). Understandably, the better the time-variant voltage envelope(s) tracks the time-variant power envelope(s), the higher linearity the power amplifier(s) can achieve.

However, the time-variant ET voltage(s) can be highly susceptible to distortions caused by trace inductance, load impedance, and/or group delay, particularly when the time-variant ET voltage(s) is so generated to track the time-variant power envelope(s) of a higher modulation bandwidth (e.g., >200 MHz) RF signal(s). As a result, the time-variant voltage envelope(s) may become misaligned with the time-variant power envelope(s) of the RF signal(s), thus causing unwanted distortions (e.g., amplitude clipping) in the RF signal(s). In this regard, it is desirable to reduce distortions caused by trace inductance, load impedance, and/or group delay in the time-variant ET voltage(s).

SUMMARY

Embodiments of the disclosure relate to an equalizer circuit in an envelope tracking (ET) integrated circuit (ETIC). The ETIC is configured to generate an ET voltage based on a target voltage for amplifying a radio frequency (RF) signal(s). Given that the ETIC has inherent impedance and group delay that can cause distortion in the ET voltage, an equalizer circuit is provided in the ETIC to equalize the target voltage prior to generating the ET voltage. Specifically, the equalizer circuit generates an equalized target voltage to offset the inherent impedance and a modified target voltage to mitigate the group delay. Accordingly, the equalizer circuit can output a processed target voltage, which can include the equalized target voltage and/or the modified target voltage, for generating the ET voltage. As a result, it is possible to reduce distortion resulting from the inherent impedance and group delay, especially when the RF signal(s) is modulated in a wide modulation bandwidth (e.g., >200 MHz).

In one aspect, an equalizer circuit is provided. The equalizer circuit includes a voltage input that receives a target voltage. The equalizer circuit also includes an impedance equalizer circuit configured to equalize the target voltage based on a predefined transfer function to generate an equalized target voltage. The equalizer circuit also includes a target voltage processing circuit configured to modify the target voltage to generate a modified target voltage having a reduced dynamic range lower than the target voltage. The equalizer circuit also includes a voltage output that outputs a processed target voltage comprising at least one of the equalized target voltage and the modified target voltage.

In another aspect, an ETIC is provided. The ETIC includes an equalizer circuit. The equalizer circuit includes a voltage input that receives a target voltage. The equalizer circuit also includes an impedance equalizer circuit configured to equalize the target voltage based on a predefined transfer function to generate an equalized target voltage. The equalizer circuit also includes a target voltage processing circuit configured to modify the target voltage to generate a modified target voltage having a reduced dynamic range lower than the target voltage. The equalizer circuit also includes a voltage output that outputs a processed target voltage comprising at least one of the equalized target voltage and the modified target voltage. The ETIC also includes an ET voltage circuit coupled to the voltage output. The ET voltage circuit is configured to generate an ET voltage based on the processed target voltage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to an equalizer circuit in an envelope tracking (ET) integrated circuit (ETIC). The ETIC is configured to generate an ET voltage based on a target voltage for amplifying a radio frequency (RF) signal(s). Given that the ETIC has inherent impedance and group delay that can cause distortion in the ET voltage, an equalizer circuit is provided in the ETIC to equalize the target voltage prior to generating the ET voltage. Specifically, the equalizer circuit generates an equalized target voltage to offset the inherent impedance and a modified target voltage to mitigate the group delay. Accordingly, the equalizer circuit can output a processed target voltage, which can include the equalized target voltage and/or the modified target voltage, for generating the ET voltage. As a result, it is possible to reduce distortion resulted from the inherent impedance and group delay, especially when the RF signal(s) is modulated in a wide modulation bandwidth (e.g., >200 MHz).

Figure 1A:
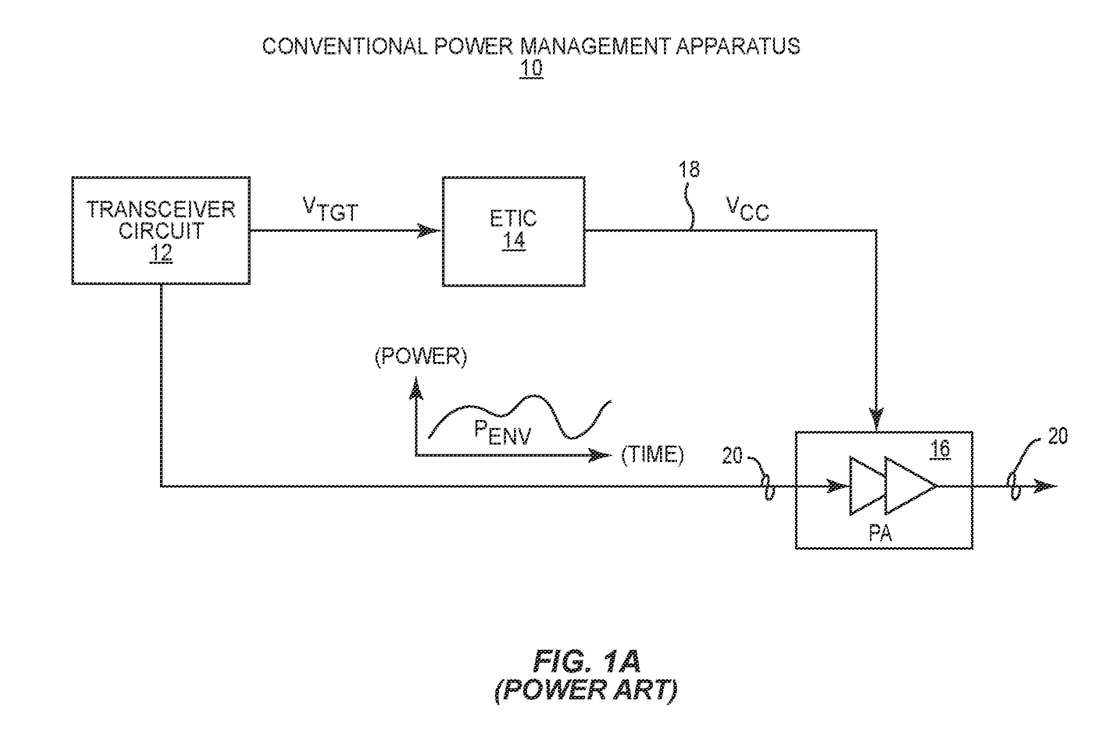
FIG. 1A is a schematic diagram of an exemplary conventional envelope tracking (ET) power amplifier apparatus configured to generate an ET voltage.
Figure 1B:
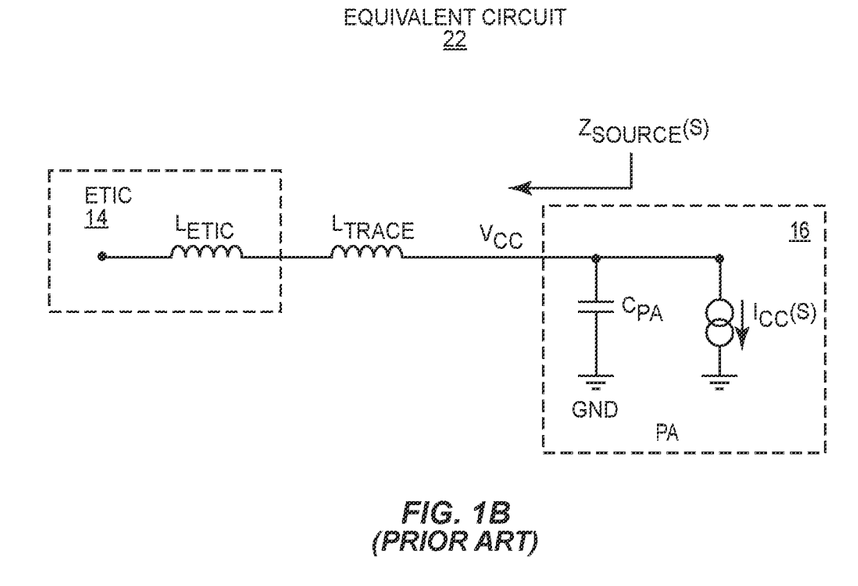
FIG. 1B is a schematic diagram of an exemplary equivalent circuit for illustrating various impedances and/or inductances in the conventional power amplifier apparatus of FIG. 1 that can distort the ET voltage.
Figure 2:
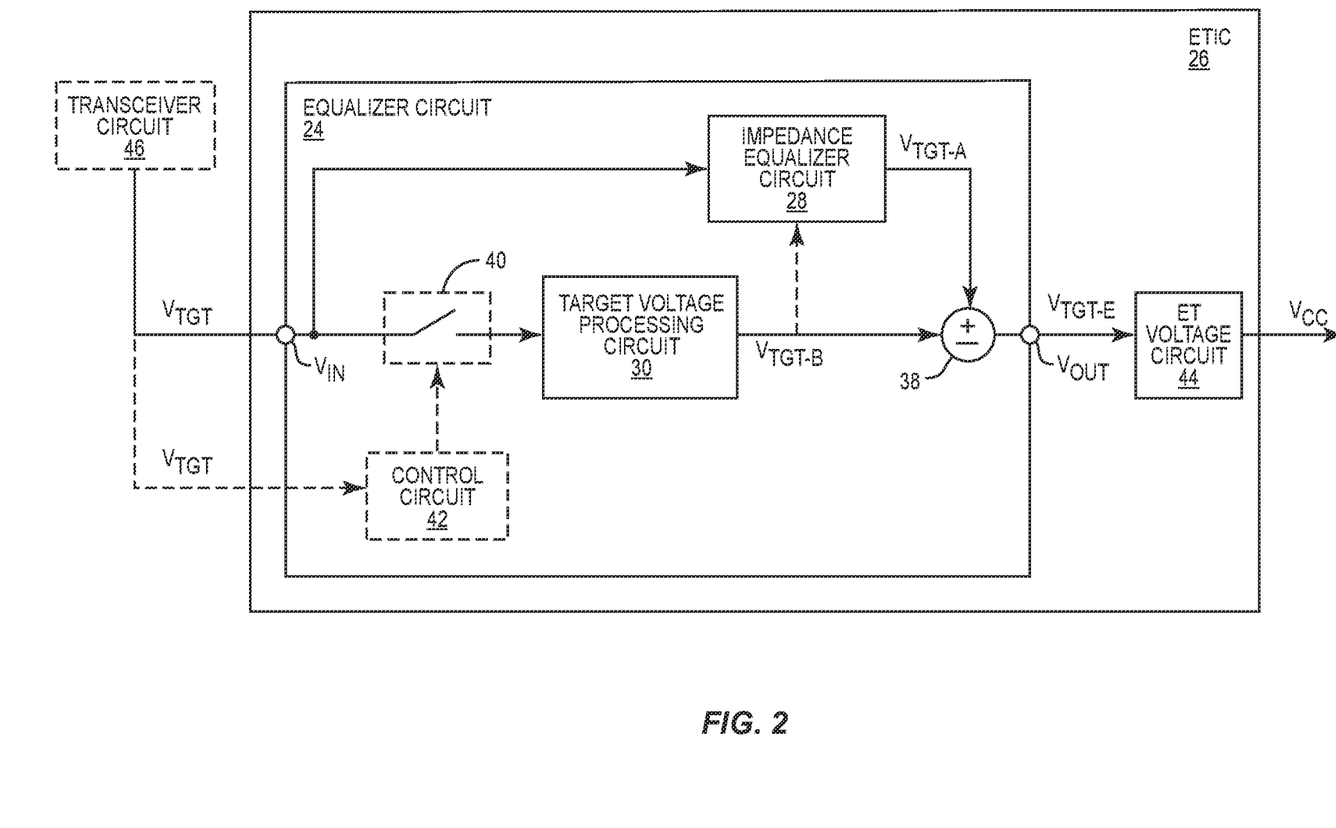
FIG. 2 is a schematic diagram of an exemplary equalizer circuit provided in an ET integrated circuit (ETIC) and configured according to embodiments of the present disclosure to reduce potential voltage disturbance in an ET voltage.

Before discussing the equalizer circuit and the ETIC according to the present disclosure, starting at FIG. 2, an overview of a conventional ET power management apparatus that can experience ET voltage distortion is first provided with reference to FIGS. 1A and 1B.

FIG. 1A is a schematic diagram of an exemplary conventional power management apparatus 10 configured to generate an ET voltage $V_{CC}$. The conventional power management apparatus 10 includes a transceiver circuit 12, an ETIC 14, a power amplifier circuit 16, and a signal line(s) 18 that couples the ETIC 14 to the power amplifier circuit 16.

The transceiver circuit 12 is configured to generate and provide an RF signal 20, which is associated with a time-variant power envelope $P_{ENV}$, to the power amplifier circuit 16. The transceiver circuit 12 is also configured to generate a target voltage $V_{TGT}$ in accordance with (a.k.a. tracks) the time-variant power envelope $P_{ENV}$. The ETIC 14 is configured to generate the ET voltage $V_{CC}$ based on the target voltage $V_{TGT}$ and the power amplifier circuit 16 is configured to amplify the RF signal 20 based on the ET voltage $V_{CC}$.

Those skilled in the art will appreciate that the power amplifier circuit 16 may operate with improved efficiency and linearity when the ET voltage $V_{CC}$ accurately tracks the power envelope $P_{ENV}$ of the RF signal 20. This is achieved when the ET voltage $V_{CC}$ is temporally aligned with the target voltage $V_{TGT}$. However, temporal alignment between the ET voltage $V_{CC}$ and the target voltage $V_{TGT}$ may be complicated by various impedances, inductances, and group delays presenting in the conventional power management apparatus 10.

To illustrate the various impedances and/or inductances, FIG. 1B is a schematic diagram of an exemplary equivalent circuit 22 for illustrating the various impedances and inductances in the conventional power management apparatus 10 of FIG. 1A that can distort the ET voltage $V_{CC}$. Common elements between FIGS. 1A and 1B are shown therein with common element numbers and will not be re-described herein.

In the equivalent circuit 22, the ETIC 14 has an inherent impedance that can be modeled by an equivalent inductance $L_{ETIC}$ and the signal line(s) 20 has an inherent trance inductance that can be modeled by an equivalent trance inductance $L_{TRACE}$. Accordingly, the equivalent circuit 22 would have a total equivalent inductance $L_E$ that equals a sum of the equivalent inductance $L_{ETIC}$ and the equivalent trance inductance $L_{TRACE}$ ($L_E = L_{ETIC} + L_{TRACE}$).

The power amplifier circuit 16 can be modeled as a current source with a modulated current $I_{CC}(s)$ and have a total equivalent capacitance $C_{PA}$. Accordingly, an equivalent source impedance $Z_{SOURCE}(S)$ presented to the current source can be determined as in equation (Eq. 1) below.

$$Z_{SOURCE}(s) = \frac{s * L_E}{1 + L_E * C_{PA} * s^2} \quad \text{(Eq. 1)}$$

In the equation (Eq. 1), s represents the s-transform notation, which can be expressed as $s=j2\pi f$. The modulated current $I_{CC}(s)$ is somewhat proportional to the target voltage $V_{TGT}$ and can be expressed as in the equation (Eq. 2) below.

$$I_{CC}(s) = \frac{V_{TGT}(s)}{Z_{ICC}(s) * e^{(-s*\Delta D)}} \quad \text{(Eq. 2)}$$

In the equation (Eq. 2) above, $Z_{ICC}(s)$ represents an impedance at a collector (not shown) of the power amplifier circuit 16 and $\Delta D$ represents a group delay between the $V_{TGT}$ and the time-variant power envelope $P_{EVN}$ at an output stage (not shown) of the power amplifier circuit 16. Notably, the modulated current $I_{CC}$ can create a voltage disturbance, which is approximately equal to $Z_{SOURCE}(S) * I_{CC}(s)$, across the collector of the power amplifier circuit 16. The voltage disturbance can cause a misalignment between the ET voltage $V_{CC}$ and the power envelope $P_{ENV}$ at the power amplifier circuit 16. Consequently, the power amplifier circuit 16 can cause a distortion (e.g., amplitude clipping) in the RF signal 20. Hence, it is desirable to reduce the voltage disturbance resulted from the equivalent trance inductance $L_{TRACE}$ and the group delay $\Delta D$ in the conventional power management apparatus 10.

In this regard, FIG. 2 is a schematic diagram of an exemplary equalizer circuit 24 provided in an ETIC 26 and configured according to embodiments of the present disclosure to reduce potential voltage disturbance, as described in FIG. 1B, in an ET voltage $V_{CC}$. The ETIC 26 is configured to generate the ET voltage $V_{CC}$ based on a target voltage $V_{TGT}$, which can be a differential target voltage, as an example. Given that the ETIC 26 has inherent impedance (e.g., $L_{ETIC}$) and group delay (e.g., $\Delta D$) that can cause distortion in the ET voltage $V_{CC}$, the equalizer circuit 24 is employed to equalize the target voltage $V_{TGT}$ prior to generating the ET voltage $V_{CC}$.

In an embodiment, the equalizer circuit 24 receives the target voltage $V_{TGT}$ at a voltage input $V_{IN}$ and generates a processed target voltage $V_{TGT-E}$ at a voltage output $V_{OUT}$ based on the target voltage $V_{TGT}$. Specifically, the equalizer circuit 24 generates an equalized target voltage $V_{TGT-A}$ to offset the inherent impedance (e.g., $L_{ETIC}$) and a modified target voltage $V_{TGT-B}$ to mitigate the group delay (e.g., $\Delta D$). Accordingly, the equalizer circuit can output the processed target voltage $V_{TGT-E}$ at the voltage output $V_{OUT}$ for generating the ET voltage $V_{CC}$. As discussed below, the processed target voltage $V_{TGT-E}$ includes at least one of the equalized target voltage $V_{TGT-A}$ and the modified target voltage $V_{TGT-B}$.

In one non-limiting example, the equalizer circuit 24 can be controlled to generate the processed target voltage $V_{TGT-E}$ to include both the equalized target voltage $V_{TGT-A}$ and the modified target voltage $V_{TGT-B}$ when the target voltage $V_{TGT}$ is associated with a higher modulation bandwidth (e.g., >60 MHz). In another non-limiting example, the equalizer circuit 24 can be controlled to generate the processed target voltage $V_{TGT-E}$ to include only the equalized target voltage $V_{TGT-A}$ when the target voltage $V_{TGT}$ is associated with a lower modulation bandwidth (e.g., ≤60 MHz). Thus, by generating the ET voltage $V_{CC}$ based on the processed target voltage $V_{TGT-E}$, it is possible to reduce the voltage distortion resulted from the inherent impedance and group delay across a wide modulation bandwidth.

The equalizer circuit 24 can be configured to include an impedance equalizer circuit 28 and a target voltage processing circuit 30. The impedance equalizer circuit 28 is configured to equalize the target voltage $V_{TGT}$ based on a predefined transfer function to thereby generate the equalized target voltage $V_{TGT-A}$. In a non-limiting example, the predefined transfer function includes a second-order complex-zero term, which can offset a second-order complex-pole term caused by the equivalent trance inductance $L_{TRACE}$ in FIG. 1B, and a real-zero term, which can offset a real-pole term caused by the equivalent inductance $L_{ETIC}$ in FIG. 1B. For a more detailed description of the impedance equalizer circuit 28, please refer to U.S. patent application Ser. No. 17/412,823, now U.S. Pat. No. 12,088,263, entitled "EQUALIZER CIRCUIT AND RELATED POWER MANAGEMENT CIRCUIT."

The target voltage processing circuit 30 is configured to modify the target voltage $V_{TGT}$ to generate the modified target voltage $V_{TGT-B}$. In a non-limiting example, the modified target voltage $V_{TGT-B}$ has a reduced dynamic range lower than the target voltage $V_{TGT}$. Herein, a dynamic range of voltage refers to a maximum level (peak) minus a minimum level (bottom) of the voltage. By reducing the dynamic range of the modified target voltage $V_{TGT-B}$, it is possible to reduce delay sensitivity of the ET voltage $V_{CC}$ to thereby mitigate the group delay (e.g., $\Delta D$). For a detailed description on how the reduced dynamic range can help mitigate the group delay, please refer to U.S. Pat. No. 10,911,001 B2, issued Feb. 2, 2021, and entitled "ENVELOPE TRACKING AMPLIFIER CIRCUIT."

Figure 3:
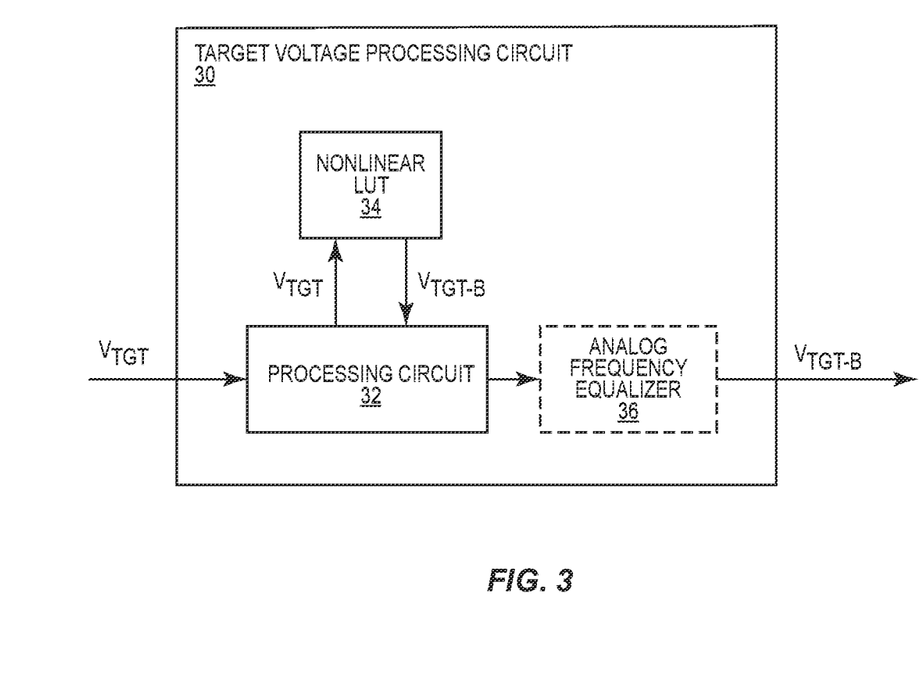
FIG. 3 is a schematic diagram providing an exemplary illustration of a target voltage processing circuit that can be provided in the equalizer circuit of FIG. 2.

In this regard, FIG. 3 is a schematic diagram providing an exemplary illustration of the target voltage processing circuit 30 in accordance with an embodiment of the present disclosure. Common elements between FIGS. 2 and 3 are shown therein with common element numbers and will not be re-described herein.

The target voltage processing circuit 30 can include a processing circuit 32 and a low-slope lookup table (LUT) 34. In a non-limiting example, the low-slope LUT 34 can correlate the target voltage $V_{TGT}$, which has a higher dynamic range, with the modified target voltage $V_{TGT-B}$ that has a lower dynamic range. Accordingly, the processing circuit 32 can modify the target voltage $V_{TGT}$ based on the low-slope LUT 34 to generate the modified target voltage $V_{TGT-B}$ having the reduced dynamic range lower than the target voltage $V_{TGT}$.

The target voltage processing circuit 30 may include an analog frequency equalizer 36. In one embodiment, the analog frequency equalizer 36 may be provided in series and after the processing circuit 32. In this regard, the analog frequency equalizer 36 can flatten a frequency response of the modified target voltage $V_{TGT-B}$. In another embodiment, the analog frequency equalizer 36 may be provided in series and before the processing circuit 32. In this regard, the analog frequency equalizer 36 can flatten frequency response of the target voltage $V_{TGT}$.

With reference back to FIG. 2, the equalizer circuit 24 can further include an output circuit 38 coupled to the impedance equalizer circuit 28, the target voltage processing circuit 30, and the voltage output $V_{OUT}$. The output circuit 38 is configured to cause the voltage output $V_{OUT}$ to output the processed target voltage $V_{TGT-E}$ at the voltage output $V_{OUT}$.

The equalizer circuit 24 may also include a switch 40 and a control circuit 42. The switch 40 is coupled between the voltage input $V_{IN}$ and the target voltage processing circuit 30. The control circuit 42, which can be a field-programmable gate array (FPGA), as an example, can control the switch 40 to couple or decouple the voltage input $V_{IN}$ to or from the target voltage processing circuit 30.

In a non-limiting example, the control circuit 42 may receive the target voltage $V_{TGT}$ that can indicate a modulation bandwidth. If the modulation bandwidth is higher than, for example, 60 MHz, the control circuit 42 can close the switch 40 to thereby couple the target voltage processing circuit 30 to the voltage input $V_{IN}$ to receive the target voltage $V_{TGT}$. Accordingly, the equalizer circuit 24 will output the processed target voltage $V_{TGT-E}$ that includes both the equalized target voltage $V_{TGT-A}$ and the modified target voltage $V_{TGT-B}$.

In contrast, if the modulation bandwidth is lower than or equal to, for example, 60 MHz, the control circuit 42 can open the switch 40 to thereby decouple the target voltage processing circuit 30 from the voltage input $V_{IN}$. As such, the target voltage processing circuit 30 is bypassed. Accordingly, the equalizer circuit 24 will output the processed target voltage $V_{TGT-E}$ that includes only the equalized target voltage $V_{TGT-A}$.

The ETIC 26 can include an ET voltage circuit 44 that is coupled to the voltage output $V_{OUT}$. In this regard, the ET voltage circuit 44 is configured to generate the ET voltage $V_{CC}$ based on the processed target voltage $V_{TGT-E}$.

Figure 4:
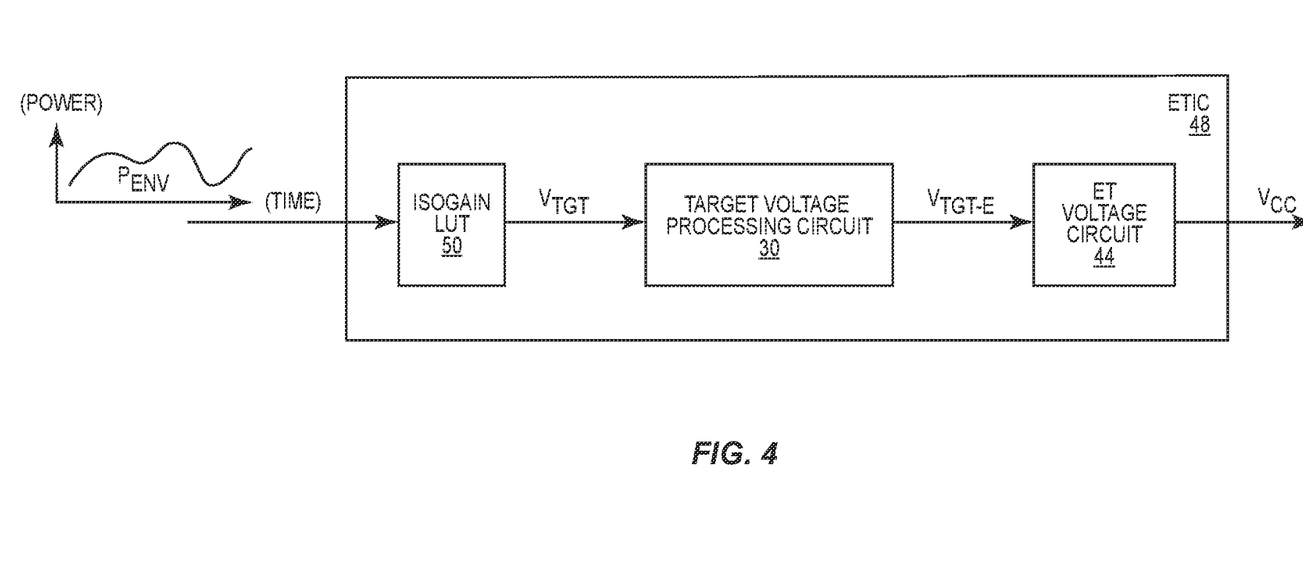
FIG. 4 is a schematic diagram of an exemplary ETIC configured according to another embodiment of the present disclosure.

In one embodiment, the equalizer circuit 24 can be configured to receive the target voltage $V_{TGT}$ from a transceiver circuit 46 coupled externally to the ETIC 26. In another embodiment, the ETIC 26 may also be configured to generate the target voltage $V_{TGT}$ internally. In this regard, FIG. 4 is a schematic diagram of an exemplary ETIC 48 configured according to another embodiment of the present disclosure. Common elements between FIGS. 2 and 4 are shown therein with common element numbers and will not be re-described herein.

In a non-limiting example, the ETIC 48 includes an isogain LUT 50. The isogain LUT 50 can include a high-slope LUT (not shown) that correlates signal amplitudes defined by a power envelope of an RF signal (not shown), such as the power envelope $P_{ENV}$ in FIG. 1A, with the target voltage $V_{TGT}$. The isogain LUT 50 may be coupled to the voltage input $V_{IN}$ and configured to generate the target voltage $V_{TGT}$ based on the power envelope of the RF signal. Herein, the high-slope LUT has a steeper slope, which corresponds to a higher dynamic range, than the low-slope LUT 34. As a result, the isogain LUT 50 can generate the target voltage $V_{TGT}$ with a higher dynamic range than the modified target voltage $V_{TGT-B}$.

Those skilled in the art will recognize improvements and modifications to the preferred embodiments of the present disclosure. All such improvements and modifications are considered within the scope of the concepts disclosed herein and the claims that follow.

What is claimed is:

1. An equalizer circuit comprising:
   a voltage input that receives a target voltage;
   an impedance equalizer circuit configured to equalize the target voltage based on a predefined transfer function to generate an equalized target voltage;
   a target voltage processing circuit configured to modify the target voltage to generate a modified target voltage having a reduced dynamic range lower than the target voltage;
   an output circuit (38) configured to:
      receive the equalized target voltage and the modified target voltage and output a processed target voltage comprising both the equalized target voltage and the modified target voltage when the target voltage is associated with a higher modulation bandwidth; and
      receive only the equalized target voltage and generate the processed target voltage comprising only the equalized target voltage when the target voltage is associated with a lower modulation bandwidth lower than the higher modulation bandwidth; and
   a voltage output coupled to the output circuit and outputting the processed target voltage.

2. The equalizer circuit of claim 1, wherein the predefined transfer function comprises a second-order complex-zero term and a real-zero term.

3. The equalizer circuit of claim 1, further comprising:
   a switch coupled between the voltage input and the target voltage processing circuit; and
   a control circuit configured to:
      close the switch to thereby couple the target voltage processing circuit to the voltage input in response to the target voltage indicating a higher modulation bandwidth; and
      open the switch to thereby decouple the target voltage processing circuit from the voltage input in response to the target voltage indicating a lower modulation bandwidth.

4. The equalizer circuit of claim 3, wherein the output circuit is further configured to cause the voltage output to output the processed target voltage comprising the equalized target voltage and the modified target voltage in response to the switch being closed.

5. The equalizer circuit of claim 3, wherein the output circuit is further configured to cause the voltage output to output the processed target voltage comprising only the equalized target voltage in response to the switch being opened.

6. The equalizer circuit of claim 1, wherein the target voltage processing circuit comprises:
   a low-slope lookup table (LUT) configured to correlate the target voltage with the modified target voltage; and a processing circuit configured to modify the target voltage based on the low-slope LUT to generate the modified target voltage.

7. The equalizer circuit of claim 6, wherein the target voltage processing circuit further comprises an analog frequency equalizer configured to equalize the modified target voltage.

8. The equalizer circuit of claim 6, wherein the target voltage processing circuit further comprises an analog frequency equalizer configured to equalize the target voltage.

9. The equalizer circuit of claim 1, wherein the impedance equalizer circuit is further configured to equalize the target voltage based on the predefined transfer function and the modified target voltage to generate the equalized target voltage.

10. An envelope tracking (ET) integrated circuit (ETIC) comprising:
an equalizer circuit comprising:
a voltage input that receives a target voltage;
an impedance equalizer circuit configured to equalize the target voltage based on a predefined transfer function to generate an equalized target voltage;
a target voltage processing circuit configured to modify the target voltage to generate a modified target voltage having a reduced dynamic range lower than the target voltage;
an output circuit configured to:
receive the equalized target voltage and the modified target voltage and output a processed target voltage comprising both the equalized target voltage and the modified target voltage when the target voltage is associated with a higher modulation bandwidth; and
receive only the equalized target voltage and generate the processed target voltage comprising only the equalized target voltage when the target voltage is associated with a lower modulation bandwidth lower than the higher modulation bandwidth; and
a voltage output coupled to the output circuit and outputs the processed target voltage; and
an ET voltage circuit coupled to the voltage output and configured to generate an ET voltage based on the processed target voltage.

11. The ETIC of claim 10, further comprising an isogain lookup table (LUT) coupled to the voltage input and configured to generate the target voltage based on a power envelope of a radio frequency (RF) signal.

12. The ETIC of claim 10, wherein the equalizer circuit further comprises:
a switch coupled between the voltage input and the target voltage processing circuit; and
a control circuit configured to:
close the switch to thereby couple the target voltage processing circuit to the voltage input in response to the target voltage indicating a higher modulation bandwidth; and
open the switch to thereby decouple the target voltage processing circuit from the voltage input in response to the target voltage indicating a lower modulation bandwidth.

13. The ETIC of claim 12, wherein the output circuit is further configured to cause the voltage output to output the processed target voltage comprising the equalized target voltage and the modified target voltage in response to the switch being closed.

14. The ETIC of claim 12, wherein the output circuit is further configured to cause the voltage output to output the processed target voltage comprising only the equalized target voltage in response to the switch being opened.

15. The ETIC of claim 10, wherein the target voltage processing circuit comprises:
a low-slope lookup table (LUT) configured to correlate the target voltage with the modified target voltage; and
a processing circuit configured to modify the target voltage based on the low-slope LUT to generate the modified target voltage.

16. The ETIC of claim 15, wherein the target voltage processing circuit further comprises an analog frequency equalizer configured to equalize the modified target voltage.

17. The ETIC of claim 15, wherein the target voltage processing circuit further comprises an analog frequency equalizer configured to equalize the target voltage.

18. The ETIC of claim 10, wherein the impedance equalizer circuit is further configured to equalize the target voltage based on the predefined transfer function and the modified target voltage to generate the equalized target voltage.

* * * * *